United States Patent
Gass et al.

(10) Patent No.: US 10,326,264 B1
(45) Date of Patent: Jun. 18, 2019

(54) AUTO-MONITORING REDUNDANCY FOR ENHANCED MINIATURE CIRCUIT BREAKER RELIABILITY

(71) Applicant: Schneider Electric USA, Inc., Andover, MA (US)

(72) Inventors: Randall Gass, Cedar Rapids, IA (US); Jason Potratz, Coralville, IA (US); Dennis William Fleege, Cedar Rapids, IA (US); Chad Mittelstadt, Cedar Rapids, IA (US); Brett Larson, Cedar Rapids, IA (US); Paul Reid, Cedar Rapids, IA (US)

(73) Assignee: Schneider Electric USA, Inc., Andover, MA (US)

( * ) Notice: Subject to any disclaimer, the term of this patent is extended or adjusted under 35 U.S.C. 154(b) by 0 days.

(21) Appl. No.: 15/963,092

(22) Filed: Apr. 25, 2018

(51) Int. Cl.
| | |
|---|---|
| *H02H 3/04* | (2006.01) |
| *H02H 1/00* | (2006.01) |
| *H01H 83/04* | (2006.01) |
| *G08B 21/18* | (2006.01) |
| *H01H 50/44* | (2006.01) |
| *H01H 50/64* | (2006.01) |
| *H02H 3/027* | (2006.01) |

(52) U.S. Cl.
CPC ........... *H02H 3/044* (2013.01); *G08B 21/182* (2013.01); *H01H 50/44* (2013.01); *H01H 83/04* (2013.01); *H02H 1/0015* (2013.01); *H01H 50/642* (2013.01); *H02H 3/027* (2013.01)

(58) Field of Classification Search
CPC ...... G08B 21/182; H01H 50/44; H01H 83/04; H01H 50/642; H02H 1/0015; H02H 3/044; H02H 3/027

USPC .......................................................... 340/644
See application file for complete search history.

(56) References Cited

U.S. PATENT DOCUMENTS

| | | | |
|---|---|---|---|
| 5,260,676 A | 11/1993 | Patel et al. | |
| 5,459,630 A | 10/1995 | MacKenzie et al. | |
| 7,317,600 B2 | 1/2008 | Huang et al. | |
| 9,608,433 B2 | 3/2017 | Simonin | |
| 2008/0186116 A1 | 8/2008 | DiSalvo et al. | |
| 2012/0212864 A1* | 8/2012 | Elms | H01H 47/002 361/49 |
| 2015/0200533 A1* | 7/2015 | Simonin | H02H 3/05 335/17 |
| 2018/0220541 A1* | 8/2018 | Aromin | H05K 5/0047 |

FOREIGN PATENT DOCUMENTS

| | | |
|---|---|---|
| WO | 2009097469 | 8/2009 |
| WO | 2014151124 | 9/2014 |

* cited by examiner

*Primary Examiner* — Joseph H Feild
*Assistant Examiner* — Sharmin Akhter
(74) *Attorney, Agent, or Firm* — Locke Lord LLP

(57) ABSTRACT

Systems and methods for auto-monitoring a trip solenoid and a switching semiconductor in a circuit breaker comprises determining whether the trip solenoid or the switching semiconductor is open-circuited or otherwise non-operational. The trip solenoid has multiple windings therein and the switching semiconductor has multiple semiconductor switches therein. The circuit breaker automatically performs a designated action if one of the multiple windings or one of the semiconductor switches is determined to be open-circuited or otherwise non-operational. In some embodiments, the circuit breaker is a miniature circuit breaker.

19 Claims, 8 Drawing Sheets

AUTO-MONITORING REDUNDANCY FOR ENHANCED MINIATURE CIRCUIT BREAKER RELIABILITY

FIELD OF THE INVENTION

The disclosed embodiments relate generally to electronic circuit breakers and particularly to miniature circuit breakers (MCB) with redundant trip circuitry for performing auto-monitoring self-tests.

BACKGROUND OF THE INVENTION

Auto-monitoring is a requirement imposed by Underwriter Laboratory Standard UL-943 for ground fault circuit interrupter (GFCI) devices in the United States. These GFCI devices are commonly used in both commercial and residential applications and include receptacles, circuit breakers, plug-in devices, and the like. The auto-monitoring requirement arose from a realization by regulators that consumers do not regularly test their GFCI devices (e.g., by pushing the "Test" button). As a result, many GFCI devices that were no longer operational due for example to aging remained in use rather than being replaced, creating potential electrical safety hazards.

UL-943 addresses the above problem, among others, by requiring a permanently connected GFCI device to have an auto-monitoring function that periodically and automatically tests the ability of the device to respond to a ground fault. If the device fails the test, the standard requires the device to enter automatically into a state that prevents the device from energizing the load, either by blocking power to the load or by repeatedly tripping. The standard additionally specifies that the auto-monitor testing must not compromise the ability of the GFCI device to respond normally to the ground fault or a grounded neutral fault.

One of the ways specified by the standard for confirming compliance with the auto-monitoring requirement is to open-circuit the trip solenoid and the switching semiconductor in the device. However, in electronic circuit breakers, the trip solenoid and associated switching semiconductor operate to actuate the trip mechanism that cuts off electricity to the load. Any test that requires the trip solenoid or the switching semiconductor to be open-circuited would render them unable to actuate the trip mechanism. Consequently, an exception was specified in UL-943 that allowed circuit breakers to avoid the auto-monitoring testing of the trip solenoid and the switching semiconductor.

But trip solenoids and switching semiconductors are susceptible to failure like other electrical components. Not testing them may lead consumers to believe incorrectly that non-operational circuit breakers are still functioning properly, there being no indications to the contrary. This creates potential electrical safety hazards. Moreover, a request was submitted recently to the UL urging removal of the circuit breaker trip solenoid and switching semiconductor exception. If the UL adopts the request, which seems likely, circuit breakers will need to comply fully with the auto-monitoring testing.

Prior attempts to implement auto-monitoring in circuit breakers have involved locking out the circuit breaker after, not during, a test. For example, US Published Application No. 20080186112 describes a circuit breaker that does not trip in response to a failed push-to-test, but once turned off, the circuit breaker is locked out and cannot turn back on. However, these attempts still require a manual operation by the user, potentially permitting unsafe circuit breakers to continue delivering power. They also require additional electronic components and mechanical interfaces, which is not feasible in certain circuit breaker applications, such as MCBs, that have strict size constraints.

Accordingly, a need exists for a way to fully accommodate the auto-monitoring requirement in circuit breakers, even in circuit breakers with strict size constraints, such as MCBs.

SUMMARY OF THE DISCLOSED EMBODIMENTS

At a high level, the embodiments disclosed herein are directed to improved systems and methods for accommodating auto-monitoring in electronic circuit breakers. The systems and methods use circuit redundancy to allow circuit breaker trip solenoids and switching semiconductors to be automatically and periodically tested while still being able to trip the circuit breakers in the event of a ground fault or an arc fault. The circuit redundancy is implemented in a way that uses the same basic circuit breaker layout and volume while minimizing cost and component count. Such an arrangement allows the disclosed circuit redundancy to be deployed in any number of circuit breaker applications, including applications with strict size constraints, such as MCBs.

In some embodiments, the disclosed circuit redundancy is implemented by providing two or more separate but parallel windings in a circuit breaker trip solenoid and two or more separate but parallel semiconductor switches in the circuit breaker switching semiconductor. The two or more windings are connected to the two or more semiconductor switches such that, when turned on, each semiconductor switch can allow current to flow through and thereby energize at least one of the windings. In this way, if one of the windings in the trip solenoid is open-circuited or otherwise fails the auto-monitoring testing, the remaining winding or windings may be used to trip the circuit breaker. Likewise, if one of the semiconductor switches is open-circuited or otherwise fails the auto-monitoring testing, the remaining semiconductor switch or switches may be used to trip the circuit breaker.

In some embodiments, the two or more windings may be wound simultaneously such that they are intertwined or interleaved within the trip solenoid. In some embodiments, the two or more windings may be wound so that they occupy different sections within the trip solenoid instead of being intertwined. In some embodiments, the two or more windings may be wound so that they form different layers of windings within the trip solenoid. In some embodiments, it is also possible to implement the two or more windings as two or more separate trip solenoids and/or the two or more switching semiconductors as two or more discrete switching semiconductors.

In general, in one aspect, the disclosed embodiments are directed to a method for auto-monitoring a trip solenoid and a switching semiconductor in a circuit breaker. The method comprises, among other things, testing the trip solenoid and the switching semiconductor in the circuit breaker, the trip solenoid having multiple parallel windings therein and the switching semiconductor having multiple parallel semiconductor switches therein. The method further comprises automatically performing a designated action if one of the multiple windings or one of the semiconductor switches is open-circuited or otherwise non-operational.

In general, in another aspect, the disclosed embodiments are directed to a circuit breaker. The circuit breaker comprises, among other things, a trip solenoid having multiple parallel windings therein and a switching semiconductor having multiple parallel semiconductor switches therein. The switching semiconductor is connected to the trip solenoid such that each semiconductor switch allows current to flow through least one winding. The circuit breaker further comprises a controller connected to the switching semiconductor, the controller configured test the trip solenoid and the switching semiconductor and perform a designated action if one of the windings or one of the semiconductor switches is open-circuited or otherwise non-operational.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve a commercial embodiment. Such implementation specific decisions may include, and likely are not limited to, compliance with system related, business related, government related and other constraints, which may vary by specific implementation, location and from time to time. While a developer's efforts might be considered complex and time consuming, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
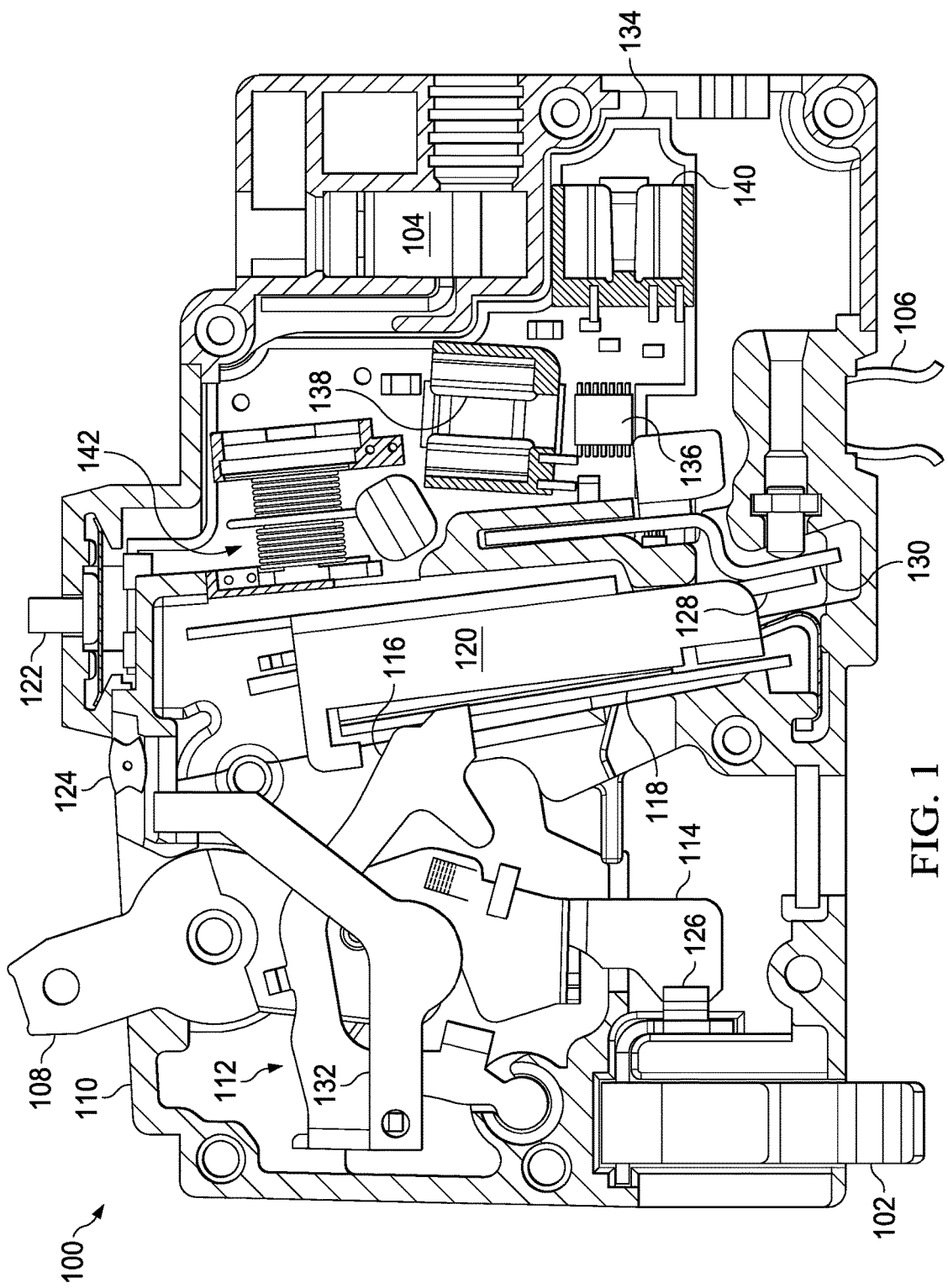
FIG. 1 illustrates an exemplary circuit breaker having circuit redundancy according to aspects of the disclosed embodiments.

Referring now to FIG. 1, components of a circuit breaker 100 according to the disclosed embodiments are shown. As is typical, the circuit breaker 100 includes a power line terminal 102, a load terminal 104, and a neutral terminal 106. A handle 108 protruding from a casing 110 allows the circuit breaker 100 to be switched amongst an OFF state, an ON state, and a tripped state. The handle 108 engages a trip mechanism, indicated generally at 112, and may be used to set the trip mechanism 112 and thus the circuit breaker 100 according to one of the above states. The trip mechanism 112 may include, among other things, a rotating contact arm 114, a spring biased trip lever 116, a latch 118, and a metallic yoke 120. A push-to-test button 122 protruding from the casing 110 allows a user to perform manual testing of the circuit breaker in a known manner. In some embodiments, a viewing window 124 in the casing 110 provides a visual indication of whether the circuit breaker is in the tripped state. These components are common in many types of circuit breakers, including miniature circuit breakers "MCB" as well as molded case circuit breakers "MCCB."

It should also be noted that although the circuit breaker 100 depicted in FIG. 1 is a single-pole circuit breaker, the principles and teachings disclosed herein are equally applicable to multi-pole circuit breakers. Further, the disclosed embodiments are considered to encompass both ground fault circuit interrupters (GFCI), arc fault circuit interrupters (AFCI) as well as dual function (AFCI & GFCI) circuit interrupters. In short, any circuit breaker that employs a shunt trip is considered as falling within the scope of the disclosed embodiments.

Operation of the circuit breaker 100 is well known in the art and is described only in general terms here. Generally, switching the handle 108 into the ON position causes the spring biased trip lever 116 to be latched by the latch 118. With the trip lever 116 latched, the rotating contact arm 114 is free to rotate into contact with an electrical contact 126 connected to the power line terminal 102. The circuit breaker 100 is now ON. When there is an overcurrent, increased heat from the overcurrent causes a bimetal strip 128 to bend or deform in a clockwise direction, moving the yoke 120 and hence the latch 118 away from the trip lever 116. This releases the trip lever 116 to swing clockwise, forcing the contact arm 114 away from the electrical contact 126 and breaking the connection with the power line terminal 102. The circuit breaker 100 is now tripped. In a similar manner, a short-circuit current causes an armature 130 to become magnetized, attracting the metal yoke 120 and hence the latch 118 away from the trip lever 116. This again trips the circuit breaker 100 in the manner described above. When the circuit breaker 100 is thus tripped, a colored trip flag 132 moves into view of the viewing window 124 to inform the user that the circuit breaker 100 is tripped.

Also shown in FIG. 1 is a circuit board 134 that provides, among other things, ground fault and arc fault detection for the circuit breaker 100. The circuit board 134 typically has a number of discrete and integrated circuit components mounted thereon, including a controller 136, a ground fault current transformer and associated ground fault sensing circuitry 138, and an arc fault current transformer and associated arc fault sensing circuitry 140. The controller 136 operates to detect ground faults and arc faults from signals provided by the ground fault sensing circuitry 138 and the arc fault sensing circuitry 140, respectively, in a manner known to those skilled in the art. Examples of suitable controllers that may be used include a microcontroller (e.g., a PIC12F617), a digital signal processor (DSP), an ASIC device, and the like. Upon detection of either a ground fault, including a grounded neutral fault, or an arc fault, the controller 136 energizes a trip solenoid 142, causing it to become magnetized and pull the metal yoke 120 and hence the latch 118 away from the trip lever 116, thereby tripping the circuit breaker 100 in the manner described above.

In accordance with the disclosed embodiments, the trip solenoid 142 is a multi-winding trip solenoid that has two or more separate but parallel windings therein. The two or more windings are connected to a switching semiconductor (not expressly shown) composed of two or more separate but parallel semiconductor switches, each of which when turned on allows current to flow through and thereby energize at least one of the windings. In this way, the multiple windings provide the circuit breaker 100 with circuit redundancy that can advantageously accommodate auto-monitoring of the circuit breaker 100. Specifically, if one of the windings in the trip solenoid 142 is open-circuited or otherwise fails the auto-monitoring testing, the remaining winding or windings may still be used to actuate the trip mechanism 112. Likewise, if one of the semiconductor switches is open-circuited or otherwise fails the auto-monitoring testing, the remaining semiconductor switch or switches may still be used to actuate the trip mechanism 112.

The use of two or more windings in the trip solenoid 142 has an additional advantage in that the windings can be wound around the same trip solenoid 142. There is no need to rearrange components in the circuit breaker 100 or otherwise alter its layout to make room for the additional winding or windings. This allows the disclosed embodiments to be implemented in virtually any type of circuit breaker applications, particularly circuit breaker applications with strict size constraints, such as MCBs.

Figure 2:
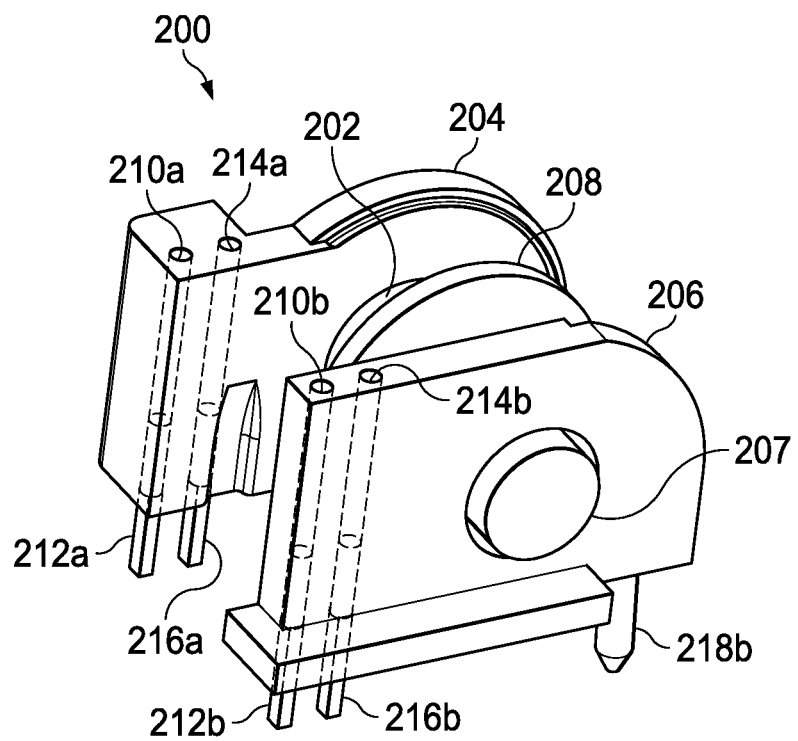
FIG. 2 illustrates an exemplary trip solenoid having circuit redundancy according to aspects of the disclosed embodiments.

FIG. 2 illustrates a perspective view of a multi-winding trip solenoid 200 in accordance with the disclosed embodiments that may be used as the trip solenoid 142 from FIG. 1. In FIG. 2, the multi-winding trip solenoid 200 is shown without any windings in order that a bobbin 202 of the solenoid may be better seen. The bobbin 202 has a generally cylindrical shape and is made of a non-metallic, non-conductive material. A front wall 204 forms one end of the bobbin 202 and a rear wall 206 forms the other end of the bobbin 202. In some embodiments, an optional disk shaped divider 208 may be provided on the bobbin 202 between the front wall 204 and the rear wall 206 coaxial with the bobbin 202. A metallic plunger 207 is mounted within the center of the bobbin 202 that becomes magnetized in the presence of an electric field. This plunger 207 may be movable or stationary within the bobbin 202 depending on the desired interface with the yoke 120.

In some embodiments, the plunger 207 may be constructed of or otherwise include a bi-stable material that has magnetic remnance. A plunger made with such a bi-stable material remains magnetized until a reverse magnetizing field is applied. This means the circuit breaker cannot be turned ON after it has been tripped until a reverse magnetizing current is applied to one of the windings.

Each wall 204, 206 has multiple openings formed therein for receiving separate but parallel windings, as well as multiple pin contacts extending therefrom for connecting the separate windings to the circuit board 134 (see FIG. 1). For example, openings 210a and 210b in the front wall 204 and the rear wall 206, respectively, receive a first winding therein. Similarly, pin contacts 212a and 212b in the front wall 204 and the rear wall 206 respectively connect the first winding to the circuit board 134. Likewise, openings 214a and 214b in the front wall 204 and the rear wall 206, respectively, receive a second winding therein, while pin contacts 216a and 216b in the front wall 204 and the rear wall 206 respectively connect the second winding to the circuit board 134. Posts 218a and 218b (only 218b is visible here) extend from the front wall 204 and the rear wall 206, respectively, to anchor the trip solenoid 200 to the circuit board 134.

Figure 2A:
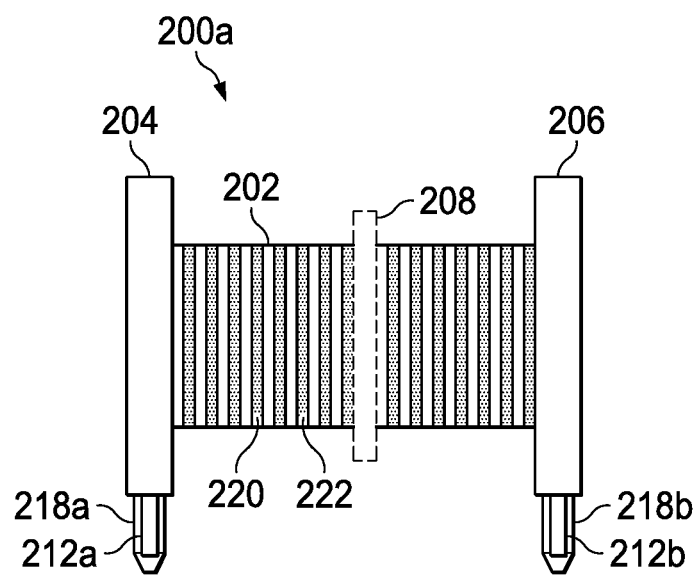
FIGS. 2A-2C illustrate exemplary implementations of the trip solenoid of FIG. 2 according to aspects of the disclosed embodiments.
Figure 2B:
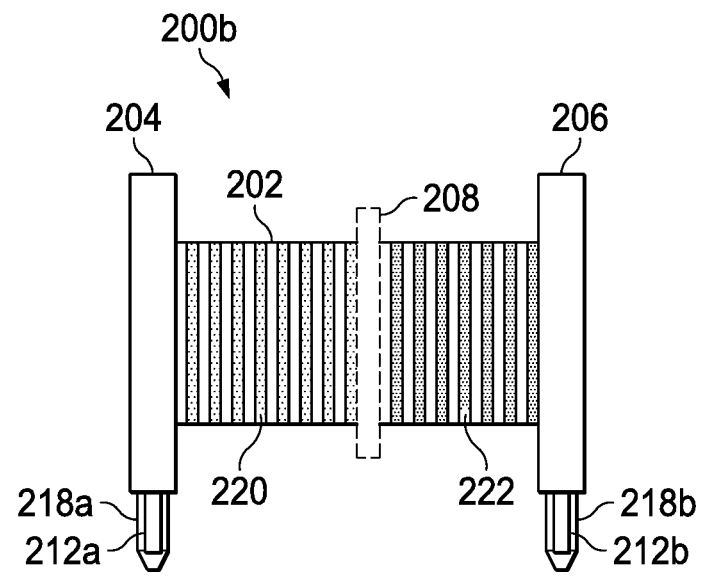
Figure 2C:
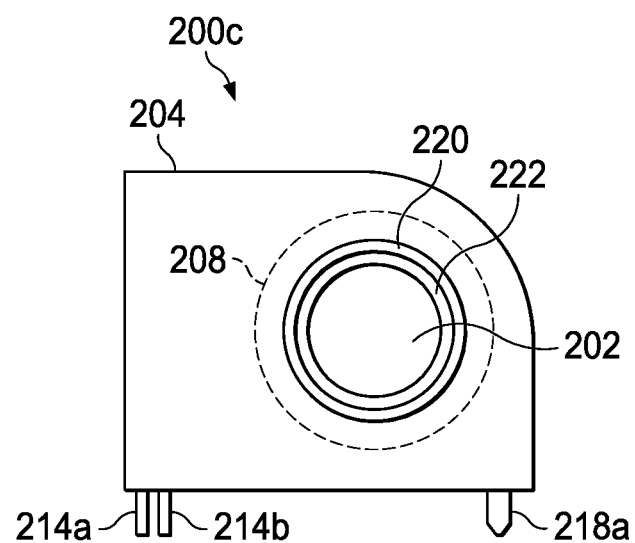

FIGS. 2A-2C show exemplary implementations 200a-200c, respectively, of the multi-winding trip solenoid 200 having separate but parallel windings 220 and 222 wound around the bobbin 202.

As can be seen in FIG. 2A, in some embodiments, the separate windings 220 and 222 may be wound around the bobbin 202 simultaneously in a sort of intertwined or interleaved fashion. In other embodiments, as shown in FIG. 2B, the separate windings 220 and 222 may be wound around the bobbin 202 on opposite sides thereof instead of being intertwined. Where the divider 208 is present, one winding 220 may occupy one side of the divider and the other winding 222 may occupy the other side of the divider.

FIG. 2C shows yet another implementation of the multi-winding trip solenoid 200 where the separate windings 220 and 222 are wound in separate layers around the bobbin 202. In this view, the rear wall 206 has been removed in order to show the trip solenoid 200 in profile. As can be seen, one winding 220 may form a first winding layer around the bobbin 202 and the other winding 222 may form a second winding layer over the first winding layer.

In the implementations 200a-200c of FIGS. 2A-2C, the number of turns for each winding 220 and 222 may be selected as needed depending on a particular application. As well, the type of wire (e.g., copper, aluminum, etc.), gauge of wire, thickness of insulation, and the like, used for the windings 220 and 222 may be selected as needed depending on the particular application.

Figure 3:
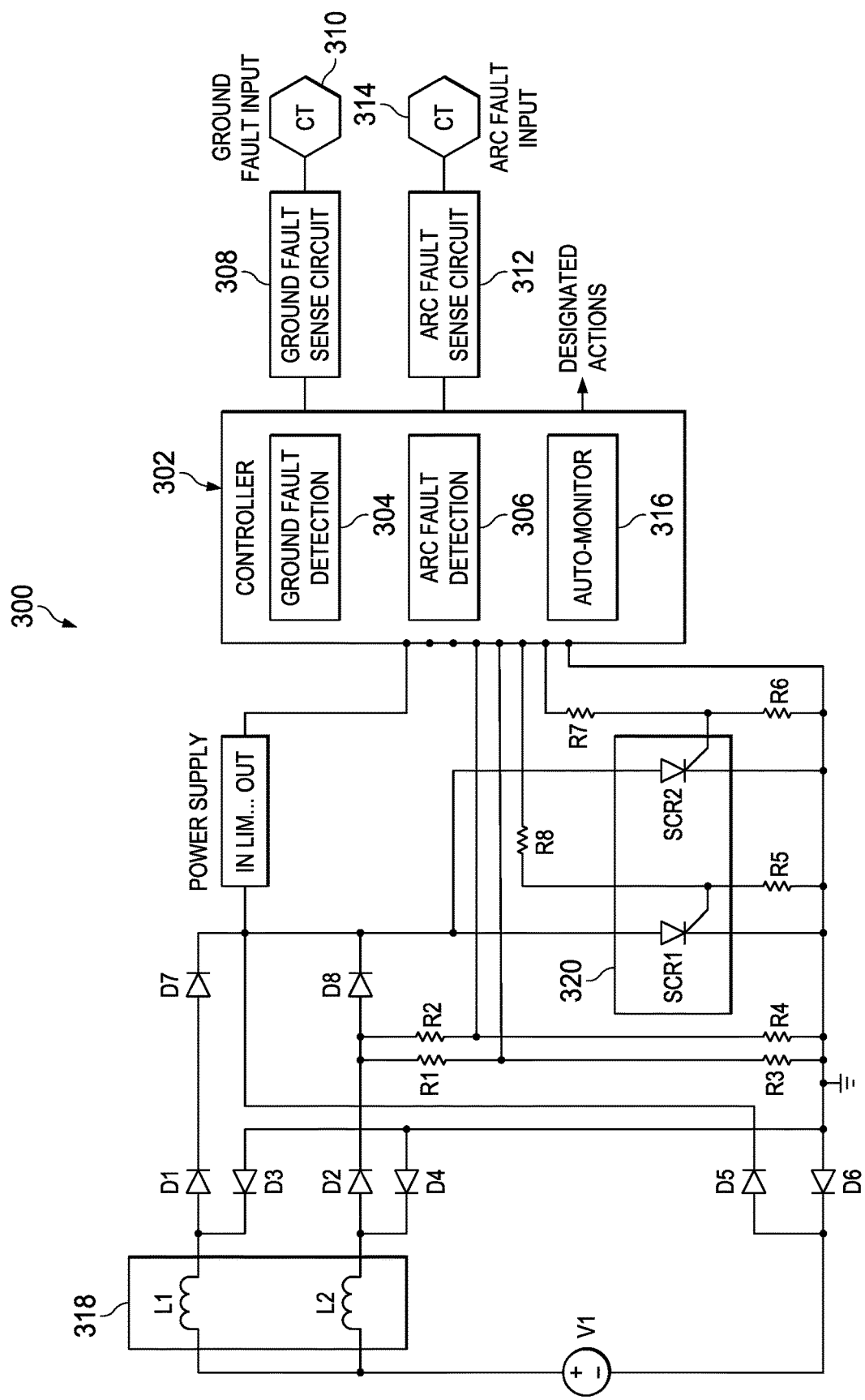
FIGS. 3-4 are functional diagrams representing exemplary implementations of a circuit breaker having circuit redundancy according to aspects of the disclosed embodiments.

Turning now to FIG. 3, a functional diagram is shown for a circuit breaker 300 having circuit redundancy according to the disclosed embodiments. The circuit breaker 300 is similar to the circuit breaker 100 from FIG. 1 in so far as it can, among other things, detect ground faults and arc faults and actuate a trip mechanism (not expressly shown) accordingly. To this end, the circuit breaker 300 includes a controller 302 having a ground fault detection module 304 and an arc fault detection module 306. The ground fault detection module 304 operates to detect ground faults, including grounded neutral faults, from signals provided by a ground fault sense circuit 308 and associated current transformer 310. The arc fault detection module 306 similarly operates to detect arc faults from signals provided by an arc fault sense circuit 312 and associated current transformer 314. When a ground fault or an arc fault is detected, the controller 302 energizes a trip solenoid 318 that actuates the trip mechanism and trips the circuit breaker 300.

The controller 302 further includes an auto-monitoring module 316 that functions to automatically and periodically perform testing of the various components of the circuit breaker 300, including the trip solenoid 318 and corresponding switching semiconductor 320. In order to accommodate operation of the auto-monitoring module 316, the trip solenoid 318 may be composed of separate but parallel windings, represented here as L1 and L2. Likewise, and the switching semiconductor 220 may be composed of separate but parallel semiconductor switches, represented here as SCR1 and SCR2, in a single integrated package. The windings L1 and L2 are connected in a manner such that turning on either semiconductor switches SCR1 or SCR2 allows current to flow through at least one of the windings L1 and L2. Any suitable semiconductor switch may be used as the semiconductor switches SCR1 and SCR2, including a silicon controlled rectifier (SCR), thyristor, field-effect transistor (FET), and the like, without departing from the scope of the disclosed embodiments.

Each of the semiconductor switches SCR1 and SCR2 is separately connected to and may be independently controlled by the controller 302. For example, the first semiconductor switch SCR1 is controlled by the controller 302 through a voltage divider composed of resistors R8 and R5, while the second semiconductor switch SCR2 is controlled by the controller 302 through a voltage divider composed of resistors R7 and R6. This arrangement allows the controller 302 to separately turn on each semiconductor switch SCR1 or SCR2 to energize each winding L1 or L2 as needed. Thus, if one of the semiconductor switches SCR1 or SCR2 or one of the windings L1 or L2 is open-circuited or otherwise fails the auto-monitoring testing, the controller 302 can still trip the circuit breaker 300 using the other semiconductor switch and/or winding.

In the above embodiments, the auto-monitoring module 316 may perform the auto-monitoring and testing of the trip solenoid 318 and the switching semiconductor 320 using any suitable monitoring and testing scheme known to those skilled in the art. For example, the auto-monitoring module 316 may perform the auto-monitoring and testing by monitoring the presence or lack thereof of voltage on the output of the trip solenoid 318 for an open coil, or pulsing the switching semiconductor 320 (near the AC voltage zero crossing) and monitoring for a pulsed current through the system or monitoring the pulsed voltage on the output of the trip solenoid.

If the auto-monitoring module 316 determines that either of the windings L1 or L2 or either of the semiconductor switches SCR1 or SCR2 is non-operational, it may take one or more designated actions. These designated actions may include, for example, immediately tripping the circuit breaker 300 (i.e., by turning on the remaining semiconductor switch and thereby energizing the remaining winding) or delaying a predefined delay period before tripping (e.g., to coordinate with downstream circuits). In some embodiments, the auto-monitoring module 316 may also disable push-to-test functionality as an indication to users that a trip solenoid problem is present. Other actions may include providing an audio and/or visual alarm to users, sending an e-mail or text message to users, and/or issuing an electronic notification signal to associated facility maintenance and/or building management equipment. The auto-monitoring module 316 may also wait for a specific condition, such as a certain time interval, a certain nominal line voltage, a certain ambient temperature, or the like before initiating an auto-monitoring sequence and then tripping the circuit breaker 300 under known expected conditions. These conditions may be determined in a manner known to those skilled in the art using the controller 302. In the meantime, the controller 302 may continue checking for ground faults and arc faults, and tripping the circuit breaker 300 accordingly, while the designated actions are being performed.

Figure 4:
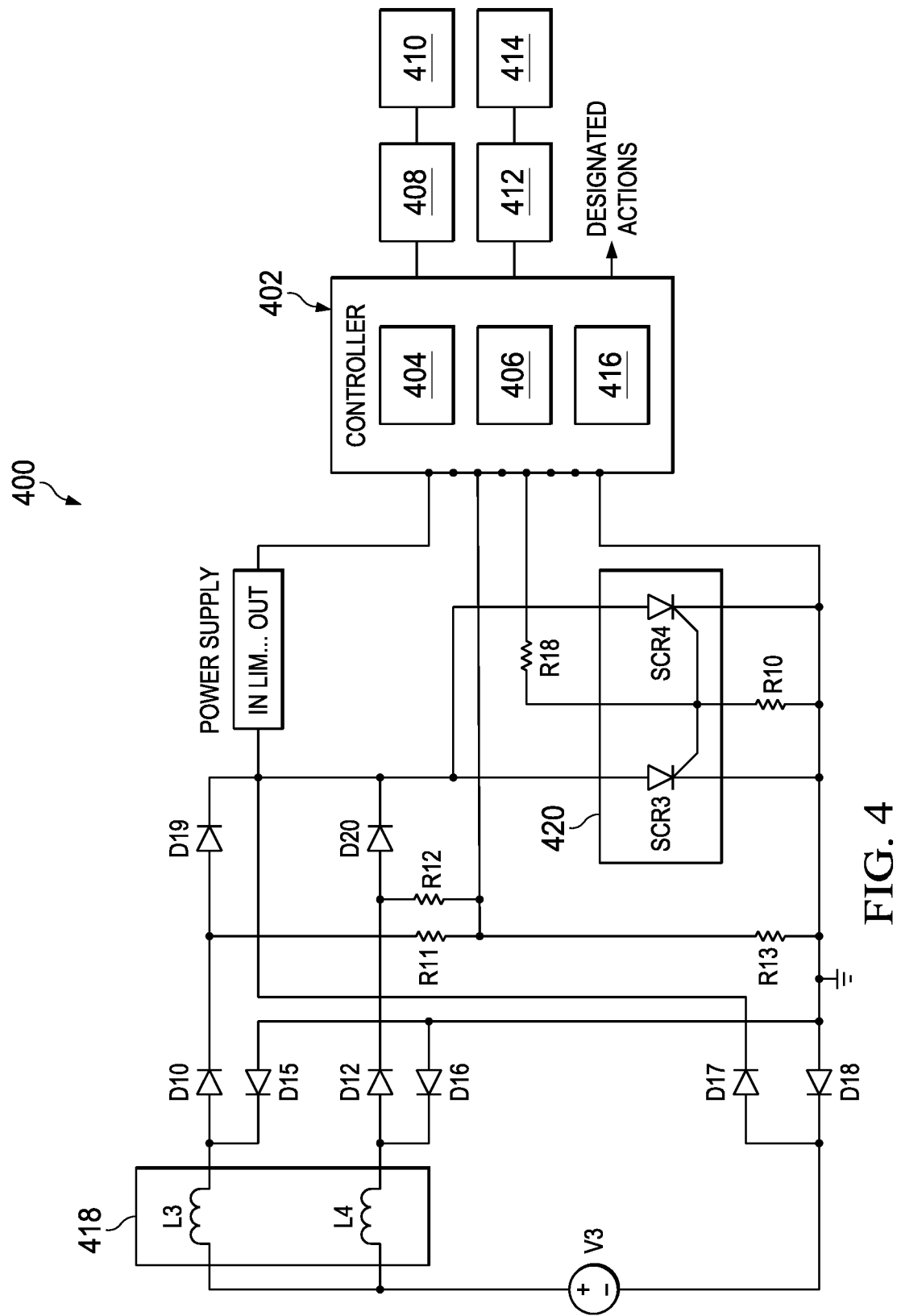

FIG. 4 is a functional diagram representing another circuit breaker 400 having circuit redundancy according to the disclosed embodiments. The circuit breaker 400 is similar to the circuit breaker 300 from FIG. 3 in so far as it includes a controller 402 having a ground fault detection module 404, an arc fault detection module 406, and an auto-monitoring module 416 therein. Circuitry 408-414 corresponding to circuitry 308-314 from FIG. 3 are also present. The auto-monitoring module 416 again functions to automatically and periodically perform testing of the various components of the circuit breaker 400, including a trip solenoid 418 and a switching semiconductor 420. The trip solenoid 418 may again be composed of separate but parallel windings, represented here as L3 and L4, and the switching semiconductor 420 may again be composed of separate but parallel semiconductor switches, represented here as SCR3 and SCR4. The windings L3 and L4 are connected in a manner such that turning on either semiconductor switches SCR3 or SCR4 allows current to flow through at least one of the windings L3 and L4.

Operation of the controller 402 and the auto-monitoring module 416 therein for the circuit breaker 400 of FIG. 4 is similar to their counterparts 302 and 316 in the circuit breaker 300 of FIG. 3. In FIG. 4, however, the semiconductor switches SCR3 and SCR4 are both controlled via the same pin on the controller 402 through a voltage divider composed of resistors R18 and R10. This arrangement beneficially allows the controller 402 to turn on the semiconductor switches SCR3 and SCR4 simultaneously.

Figure 5:
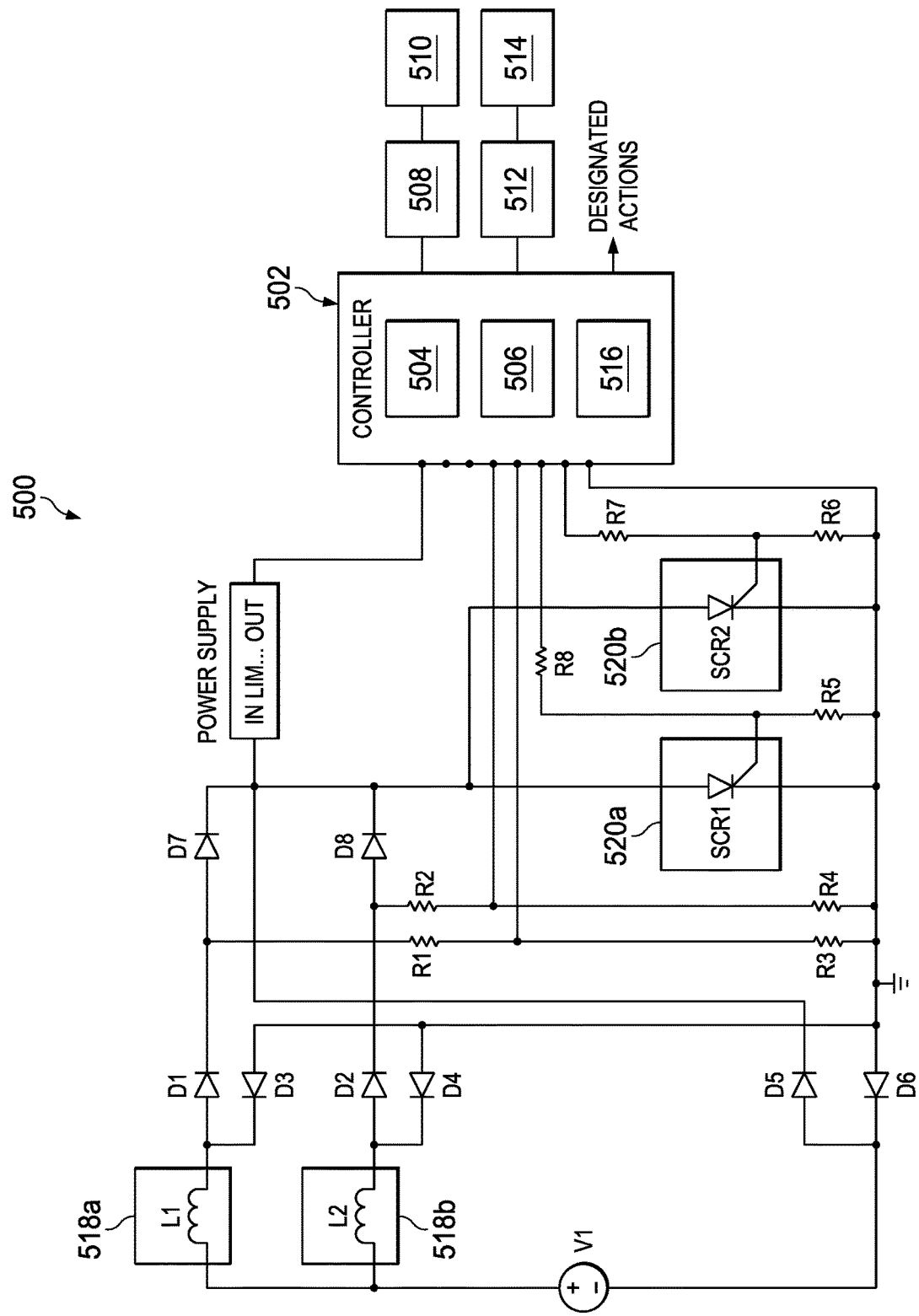
FIGS. 5-6 are functional diagrams representing alternative exemplary implementations of a circuit breaker having circuit redundancy according to aspects of the disclosed embodiments.

In some embodiments, it is also possible to implement the multiple windings as two or more separate trip solenoids and the multiple switching semiconductors as discrete semiconductor switches. FIG. 5 shows a functional diagram for an example of such an embodiment. In FIG. 5, a circuit breaker 500 is shown having virtually the same components and operations as the circuit breaker 300 from FIG. 3. However, whereas the multiple windings L1 and L2 from FIG. 3 are provided in a single trip solenoid 318, they are implemented as separate solenoids 518a and 518b in FIG. 5. Similarly, whereas the multiple semiconductor switches SCR1 and SCR2 from FIG. 3 are provided as a single integrated package 320, they are implemented as separate discrete switching semiconductors 520a and 520b in FIG. 5. Control of the switching semiconductors 520a and 520b is otherwise the same as control of the switching semiconductors 320a and 320b in FIG. 3.

Figure 6:
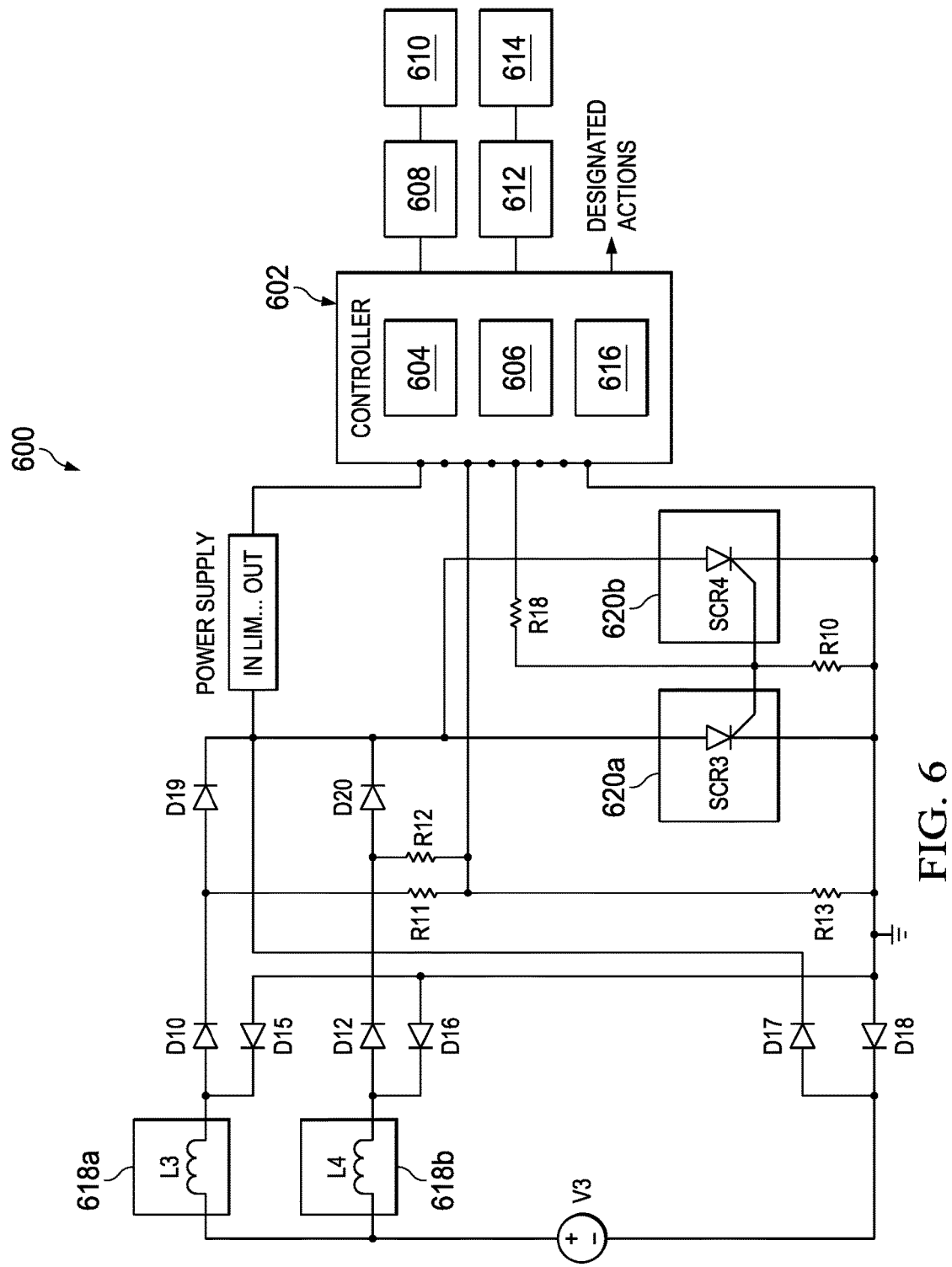

FIG. 6 shows a functional diagram for another circuit breaker 600 in which the multiple windings are provided as two or more separate trip solenoids and the multiple switching semiconductors are implemented as discrete semiconductor switches. As can be seen, the circuit breaker 600 has virtually the same components and operations as the circuit breaker 400 from FIG. 4. But whereas the multiple windings L3 and L4 from FIG. 4 are provided in a single trip solenoid 418, they are implemented as separate solenoids 618a and 618b in FIG. 6. Similarly, whereas the multiple semiconductor switches SCR3 and SCR4 from FIG. 4 are provided as a single integrated package 420, they are implemented as separate discrete switching semiconductors 620a and 620b in FIG. 6. Control of the switching semiconductors 620a and 620b is otherwise the same as control of the switching semiconductors 420a and 420b in FIG. 4.

Figure 7:
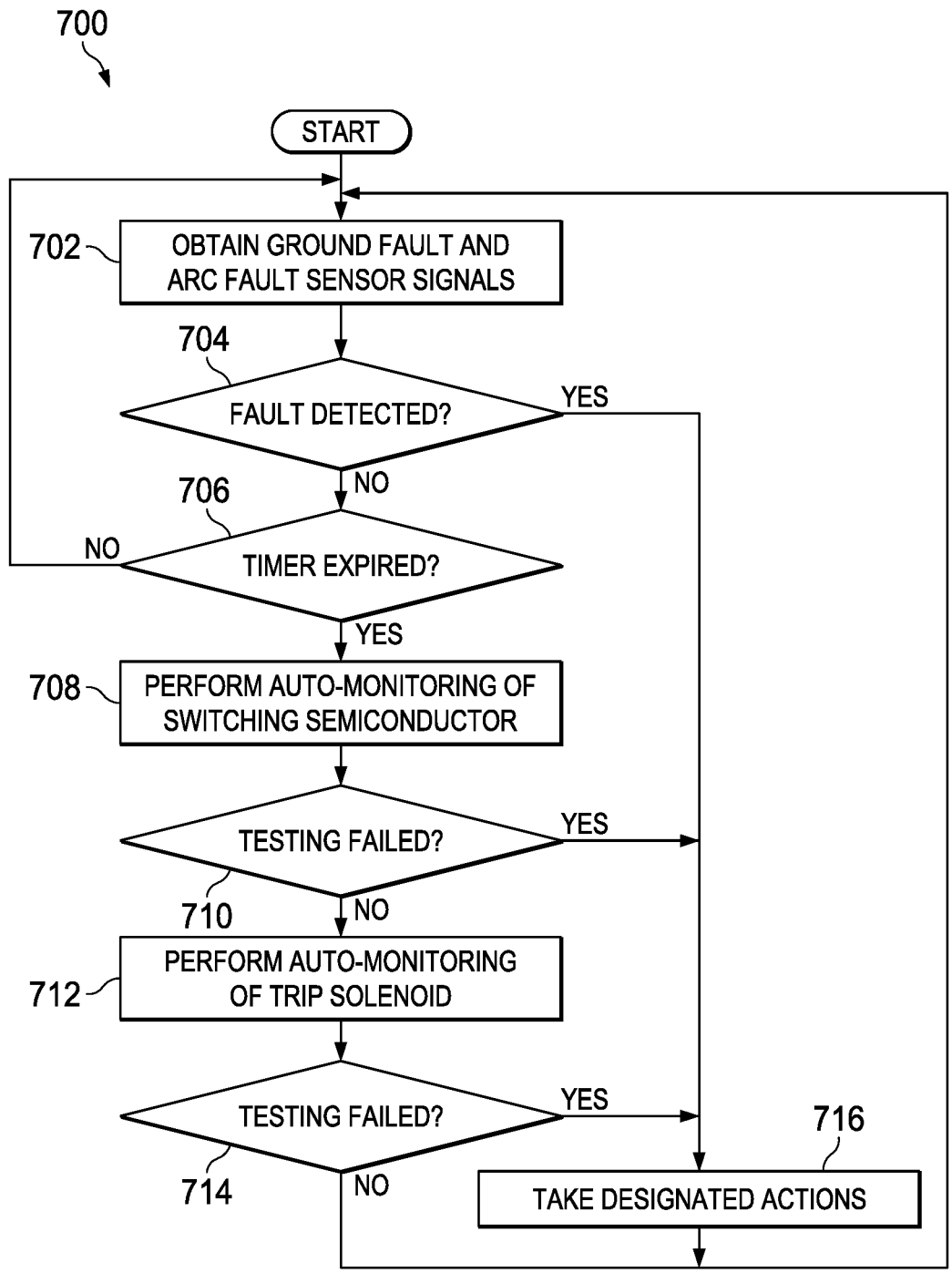
FIG. 7 illustrates an exemplary method may be used with a circuit breaker having circuit redundancy according to aspects of the disclosed embodiments.

Thus far, a number of specific implementations of a modular circuit breaker have been described. Following now in FIG. 7 is a flow chart 700, or portion thereof, outlining a method that may be used by a circuit breaker to perform auto-monitoring of a trip solenoid and switching semiconductor as described herein. Those having ordinary skill in the art will understand of course that alternative arrangements may be derived from the teachings presented herein without departing from the scope of the disclosed embodiments.

As can be seen in FIG. 7, the flow chart 700, or portion thereof, begins at block 702 where the circuit breaker obtains ground fault and arc fault sensor signals from a ground fault sense circuit and an arc fault sense circuit, respectively. At block 704, the circuit breaker checks to see if either a ground fault, including a grounded neutral fault, or an arc fault has occurred.

If the determination at block 704 is yes, then the circuit breaker proceeds to block 716 where it takes one or more designated actions. Examples of these designated actions include tripping immediately, waiting for a predefined delay period, disabling push-to-test functionality, providing an audio and/or visual alarm, sending an e-mail or text message to users, and issuing an electronic notification/signal.

If the determination at block 704 is no, then the circuit breaker proceeds to block 706 where a determination is made whether an auto-monitoring timer has expired, indicating it is time to perform auto-monitoring testing. If the determination at block 706 is no, then the circuit breaker returns to block 702 to continue checking for ground faults and arc faults.

If the determination at block 706 is yes, then the circuit breaker proceeds to block 708 to perform auto-monitoring testing of the circuit breaker switching semiconductor. In some embodiments, the circuit breaker may wait for a specific condition (e.g., a certain nominal line voltage, a certain ambient temperature, etc.) before initiating the auto monitoring testing so tripping may occur under known expected conditions.

At block 710, the circuit breaker checks to see if the switching semiconductor has failed the auto-monitoring testing. If the determination at block 710 is yes, then the circuit breaker proceeds again to block 716 where it takes one or more designated actions. This is possible because the switching semiconductor includes multiple semiconductor switches such that if one semiconductor switch fails, the remaining semiconductor switch or switches serve as a backup to allow the circuit breaker to trip.

If the determination at block 710 is no, then the circuit breaker proceeds to block 712 to perform auto-monitoring testing of the circuit breaker trip solenoid. At block 714, the circuit breaker checks to see if the trip solenoid has failed the auto-monitoring testing. If the determination at block 714 is yes, then the circuit breaker proceeds yet again to block 716 where it takes one or more designated actions. This is possible because the trip solenoid includes multiple windings such that if one winding fails, the remaining winding or windings serve as a backup to allow the circuit breaker to trip.

If the determination at block 714 is no, then the circuit breaker returns to block 702 to continue checking for ground faults and arc faults.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the scope of the disclosed embodiments as defined in the appended claims.

What is claimed is:

1. A method for auto-monitoring a trip solenoid and a switching semiconductor in a circuit breaker, the method comprising:
    testing the trip solenoid and the switching semiconductor in the circuit breaker, the trip solenoid having multiple parallel windings therein and the switching semiconductor having multiple parallel semiconductor switches therein, each parallel semiconductor switch being connected to each one of the multiple parallel windings so that each parallel semiconductor switch when energized allows current to flow through any one of the multiple parallel windings;
    automatically performing a designated action if one of the multiple parallel windings is open-circuited or otherwise non-operational; and
    automatically performing the designated action if one of the multiple parallel semiconductor switches is open-circuited or otherwise non-operational.

2. The method of claim 1, wherein the designated action includes tripping the circuit breaker immediately or after a predefined delay.

3. The method of claim 1, wherein the designated action includes disabling push-to-test functionality in the circuit breaker.

4. The method of claim 1, further comprising waiting until a predefined condition has been satisfied before testing the trip solenoid and the switching semiconductor.

5. The method of claim 4, wherein the predefined condition includes one of a predefined time interval, a predefined line voltage, or a predefined ambient temperature.

6. The method of claim 1, wherein the designated action includes one of providing an audio/visual alarm to a user, sending an electronic message to a user, or issuing an electronic notification signal to associated equipment.

7. The method of claim 1, further comprising automatically checking for a ground fault or an arc fault if no windings and no semiconductor switches are determined to be open-circuited or otherwise non-operational.

8. A circuit breaker, comprising:
    a trip solenoid having multiple parallel windings therein;
    a switching semiconductor having multiple semiconductor switches therein, the switching semiconductor connected to the trip solenoid such that each semiconductor switch is connected to each one of the multiple parallel windings so that each semiconductor switch when energized allows current to flow through any one of the multiple parallel windings; and
    a controller connected to the switching semiconductor, the controller configured test the trip solenoid and the switching semiconductor and perform a designated action if one of the multiple parallel windings is open-circuited or otherwise non-operational, and perform the designated action if one of the semiconductor switches is open-circuited or otherwise non-operational.

9. The circuit breaker of claim 8, wherein the multiple windings are wound simultaneously around the trip solenoid such that they are intertwined or interleaved within the trip solenoid.

10. The circuit breaker of claim 8, wherein the multiple windings are wound around the trip solenoid such that they occupy different sections within the trip solenoid.

11. The circuit breaker of claim 8, wherein the multiple windings are wound around the trip solenoid such that they form different winding layers within the trip solenoid.

12. The circuit breaker of claim 8, wherein the controller is configured to turn on the semiconductor switches independently of each other or together with one another.

13. The circuit breaker of claim 8, wherein the trip solenoid includes a plunger constructed of a bi-stable material with magnetic remnance.

14. The circuit breaker of claim 8, wherein the designated action includes tripping the circuit breaker immediately or waiting a predefined delay.

15. The circuit breaker of claim 8, wherein the designated action includes disabling push-to-test functionality in the circuit breaker.

16. The circuit breaker of claim 8, wherein the controller is further configured to test the trip solenoid and the switching semiconductor after a predefined condition has been satisfied.

17. The circuit breaker of claim 16, wherein the predefined condition includes one of a predefined time interval, a predefined line voltage, or a predefined ambient temperature.

18. The circuit breaker of claim 8, wherein the designated action includes one of providing an audio/visual alarm to a user, sending an electronic message to a user, issuing an electronic notification signal to associated equipment.

19. The circuit breaker of claim 8, wherein the controller is further configured to automatically check for a ground fault or an arc fault if no windings and no semiconductor switches are determined to be open-circuited or otherwise non-operational.

\* \* \* \* \*